US012740284B2

(12) United States Patent
Bai

(10) Patent No.: US 12,740,284 B2
(45) Date of Patent: Sep. 15, 2026

(54) STRETCHABLE DISPLAY PANEL

(71) Applicant: TCL CHINA STAR OPTOELECTRONICS TECHNOLOGY CO., LTD., ShenZhen (CN)

(72) Inventor: Yamei Bai, ShenZhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 301 days.

(21) Appl. No.: 18/495,960

(22) Filed: Oct. 27, 2023

(65) Prior Publication Data

US 2025/0107392 A1 Mar. 27, 2025

(30) Foreign Application Priority Data

Sep. 21, 2023 (CN) ......................... 202311228456.9

(51) Int. Cl.
*H10K 59/80* (2023.01)

(52) U.S. Cl.
CPC ............. *H10K 59/80* (2023.02); *H10K 59/87* (2023.02)

(58) Field of Classification Search
CPC .... H10K 59/131; H10K 59/757; H10K 59/87; H10K 77/111; H10K 2102/311; H10D 86/411; H10D 86/441; H10D 86/60
See application file for complete search history.

(56) References Cited

U.S. PATENT DOCUMENTS

| | | | | |
|---|---|---|---|---|
| 12,501,706 | B2 * | 12/2025 | Ham | H10D 86/60 |
| 2016/0240802 | A1 * | 8/2016 | Lee | H10K 59/351 |
| 2021/0013434 | A1 | 1/2021 | Wang | |
| 2021/0376267 | A1 | 12/2021 | Zhang et al. | |
| 2021/0408159 | A1 | 12/2021 | Zhang et al. | |
| 2021/0408204 | A1 * | 12/2021 | Zhao | H10W 90/00 |
| 2021/0408409 | A1 | 12/2021 | Wang et al. | |
| 2022/0149119 | A1 | 5/2022 | Huang et al. | |
| 2022/0261042 | A1 | 8/2022 | Hong | |
| 2023/0397479 | A1 * | 12/2023 | Xue | H10K 59/131 |

(Continued)

FOREIGN PATENT DOCUMENTS

| | | | |
|---|---|---|---|
| CN | 111653205 | A | 9/2020 |
| CN | 114335017 | A | 4/2022 |
| KR | 20100126190 | A | 12/2010 |

OTHER PUBLICATIONS

Japanese Office Action issued in corresponding Japanese Patent Application No. 2023-188599 dated Apr. 15, 2024, with machine translation, 14 pages provided.

(Continued)

*Primary Examiner* — David C Spalla
(74) *Attorney, Agent, or Firm* — HSML P.C.

(57) ABSTRACT

A stretchable display panel is provided, and includes pixel islands; and stretchable bridges each of which connects two adjacent ones of the pixel islands. An edge of each of the pixel islands includes at least one first edge portion and a second edge portion other than the at least one first edge portion, and the at least one first edge portion connects the pixel island and corresponding ones of the stretchable bridges. The stretchable display panel further includes an anti-deformation layer disposed at least partially on a periphery of the second edge portion.

18 Claims, 7 Drawing Sheets

(56) References Cited

U.S. PATENT DOCUMENTS

| | | | | |
|---|---|---|---|---|
| 2024/0032362 | A1* | 1/2024 | Lee | H01L 25/167 |
| 2024/0074281 | A1* | 2/2024 | Wu | G06F 3/0412 |
| 2024/0128279 | A1* | 4/2024 | Jeong | H10D 86/60 |
| 2024/0334720 | A1* | 10/2024 | Hu | H10K 59/00 |

OTHER PUBLICATIONS

Office Action issued in corresponding Indian Patent Application No. 202314072645, dated May 21, 2026, 7 pages provided.

* cited by examiner

STRETCHABLE DISPLAY PANEL

CROSS-REFERENCE TO RELATED APPLICATION

This application claims priority to and the benefit of Chinese Patent Application No. 202311228456.9, filed on Sep. 21, 2023, the disclosure of which is incorporated herein by reference in its entirety.

TECHNICAL FIELD

The present disclosure relates to display technologies, and in particular, to a stretchable display panel.

BACKGROUND

An Organic Light-Emitting Diode (referred briefly to as OLED) stretchable display panel has the advantages of being lighter and thinner, good in display effect, high in resolution, wide in color gamut, lower in power consumption, and capable of realizing flexible display, compared with a liquid crystal display. So, the OLED stretchable display panel is rapidly developed in recent years and has become a preferred type of stretchable display panel in a mobile terminal.

Since the OLED stretchable display panel has the function of flexible display, it can stretchably display. However, when the stretchable display panel currently performs the display function, in the stretched state, the area of display units corresponding to pixel islands is deformed, thereby affecting the display effect and reliability. Thus, these problems are urgently to be solved.

SUMMARY

The present disclosure provides a stretchable display panel, which can effectively solve the problems of reduced display effect and poor reliability existing in the existing stretchable display panel.

In one aspect, according to embodiments of the present disclosure, it is provided a stretchable display panel including: a plurality of pixel islands; and a plurality of stretchable bridges, each of which connects two adjacent ones of the pixel islands; in which an edge of each of the pixel islands includes at least one first edge portion and a second edge portion other than the at least one first edge portion, and the at least one first edge portion connects the pixel island and corresponding ones of the stretchable bridges; the stretchable display panel further includes an anti-deformation layer disposed at least partially on a periphery of the second edge portion.

In some embodiments, the anti-deformation layer has a first elastic modulus, and the stretchable bridge has a second elastic modulus, wherein the first elastic modulus is greater than the second elastic modulus.

In some embodiments, a material of the anti-deformation layer includes one of an insulating material and a metal material.

In some embodiments, the pixel island has a third elastic modulus, the first elastic modulus is greater than the third elastic modulus, and the third elastic modulus is greater than the second elastic modulus.

In some embodiments, the stretchable display panel includes a stretched state, and a non-stretched state in which the edge of the pixel island is of a quadrilateral shape and the second edge portion includes four edge corner portions, wherein the anti-deformation layer surrounds the four edge corner portions.

In some embodiments, in the non-stretched state, one of the four edge corner portions of one of the two adjacent pixel islands is arranged oppositely with one of the four edge corner portions of an other one of the two adjacent pixel islands; in the stretched state, one of the four edge corner portions of one of the two adjacent pixel islands is arranged oppositely with one of the four edge corner portions of an other one of the two adjacent pixel islands.

In some embodiments, the stretchable display panel includes a display region and a second display region, the plurality of pixel islands are provided in the first display region and the second display region, and the second display region surrounds the first display region, wherein the edge of each of ones, which are in the first display region, of the pixel islands includes four of the at least one first edge portion.

In some embodiments, in the ones of the pixel islands which are in the first display region, two of the four first edge portions are located on one side of the quadrilateral shape and other two of the four first edge portions are located on an other side of the quadrilateral shape, and the anti-deformation layer surrounds other two sides of the quadrilateral shape.

In some embodiments, the stretchable display panel includes a display region including a first display region and a second display region, the plurality of pixel islands are provided in the first display region and the second display region, and the second display region surrounds the first display region, wherein the edge of each of ones, which are in the first display region, of the pixel islands includes eight of the at least one first edge portion.

In some embodiments, in the ones of the pixel islands which are in the first display region, each side of the quadrilateral shape is provided with two of the at least one first edge portion.

In some embodiments, in the non-stretched state, one of sides of one of the two adjacent pixel islands is arranged oppositely with one of sides of an other one of the two adjacent pixel islands; in the stretched state, one of sides of one of the two adjacent pixel islands is arranged oppositely with one of sides of an other one of the two adjacent pixel islands.

In some embodiments, the stretchable display panel includes a display region including a first display region and a second display region, the plurality of pixel islands are provided in the first display region and the second display region, and the second display region surrounds the first display region, wherein the edge of each of ones, which are in the first display region, of the pixel islands includes four of the at least one first edge portion.

In some embodiments, in the ones of the pixel islands which are in the first display region, each of the sides of the pixel island is provided with one of the four first edge portions.

In some embodiments, the stretchable display panel includes a display region including a first display region and a second display region, the plurality of pixel islands are provided in the first display region and the second display region, and the second display region surrounds the first display region, wherein the edge of each of ones, which are in the first display region, of the pixel islands includes eight of the at least one first edge portion.

In some embodiments, in the ones of the pixel islands which are in the first display region, each of the sides of the pixel island is provided with two of the eight first edge portions.

In some embodiments, the edge of the pixel island is of a circular shape or a polygon.

In some embodiments, the pixel island in a stretched state has a same shape as the pixel island in a non-stretched state; and the pixel island in the stretched state has a same area as the pixel island in the non-stretched state.

A stretchable display panel is provided and includes a plurality of pixel islands; and a plurality of stretchable bridges each of which connects two adjacent ones of said pixel islands; in which an edge of the pixel island includes at least one first edge portion and a second edge portion other than the at least one first edge portion, and the at least one first edge portion connects to the pixel island and the corresponding stretchable bridges. The stretchable display panel further includes an anti-deformation layer at least partially disposed at a periphery of the second edge portion. Each anti-deformation layer is capable of supporting the edge of the corresponding pixel island and having an ability to prevent an edge shape of this pixel island from changing, thereby improving a problem that the edge shape of the pixel island changes due to stress applied to this pixel island by the stretchable bridge(s), which improves the display effect of the stretchable display panel and enhances the reliability of the stretchable display panel.

BRIEF DESCRIPTION OF THE DRAWINGS

In order that the technical solution in the embodiments of the present disclosure may be explained more clearly, reference will now be made briefly to the accompanying drawings required for the description of the embodiments. It will be apparent that the accompanying drawings in the following description are merely some of the embodiments of the present disclosure, and other drawings may be made to those skilled in the art without involving any inventive effort.

Figure 1:
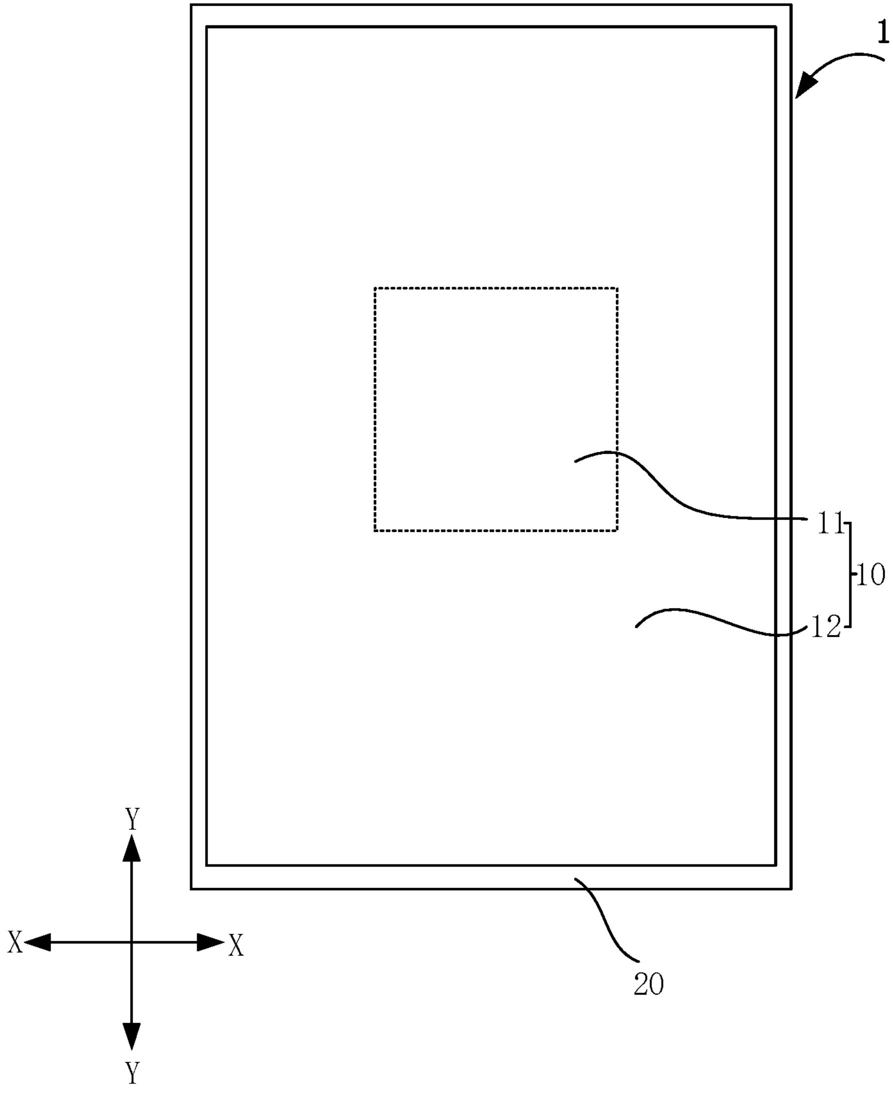
FIG. 1 is a plan schematic view of a stretchable display panel according to embodiments of the present disclosure.

List of the reference characters: stretchable display panel 1; display region 10; first display region 11; second display region 12; non-display region 20; pixel island 100; edge 101; first edge portion 102; second edge portion 103; edge corner portion 1031; stretchable bridge 200; anti-deformation layer 300; first direction X; and second direction Y; display device 30; housing 2.

DETAILED DESCRIPTION

In the following, the technical solutions in the embodiments of the present disclosure will be clearly and completely described in combination with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the disclosure. In the present disclosure, unless otherwise specified, the directional words used such as "upper" and "lower" usually refer to the upper and lower positions with respect to the device in actual use or working conditions, specifically to the direction in the drawings; while "inside" and "outside" refer to the outline of the device.

The following description provides many different embodiments or examples for implementing the different structures according to embodiments of the present disclosure. In order to simplification, components and arrangements of specific examples are described below. Of course, they are merely examples and are not intended to limit the disclosure. In addition, in embodiments of the present disclosure, it may repeat reference numerals and/or reference letters in various instances, and such a repetition is used for the purpose of simplicity and clarity, without itself indicating a relationship between the various embodiments and/or arrangements discussed. In addition, according to embodiments of the present disclosure, it is provided examples of various specific processes and materials, but one of ordinary skill in the art will recognize the application of other processes and/or the use of other materials. In the following detailed description, it is to be noted that the order in which the following examples are described is not intended to limit the preferred order of the examples.

Example 1

Figure 2:
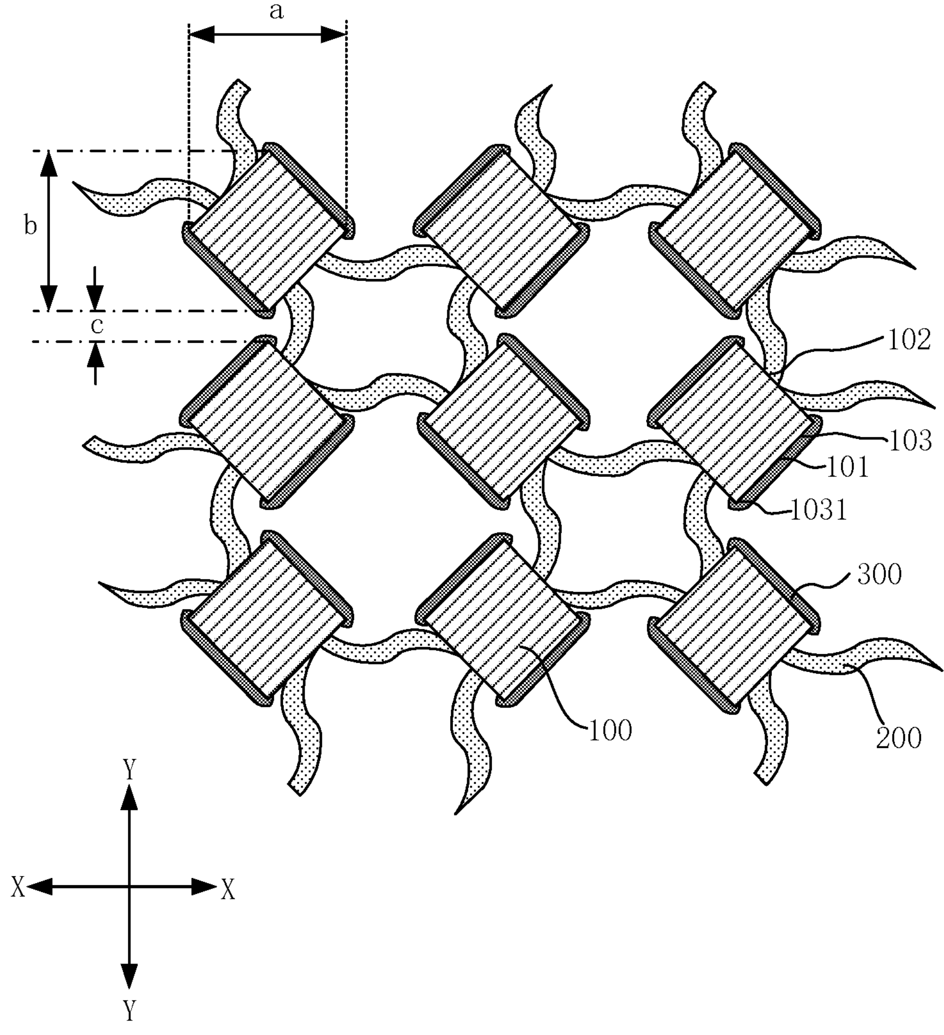
FIG. 2 is a plan schematic view of a plurality of pixel islands in a first display region in a non-stretched state according to embodiments of the present disclosure.
Figure 3:
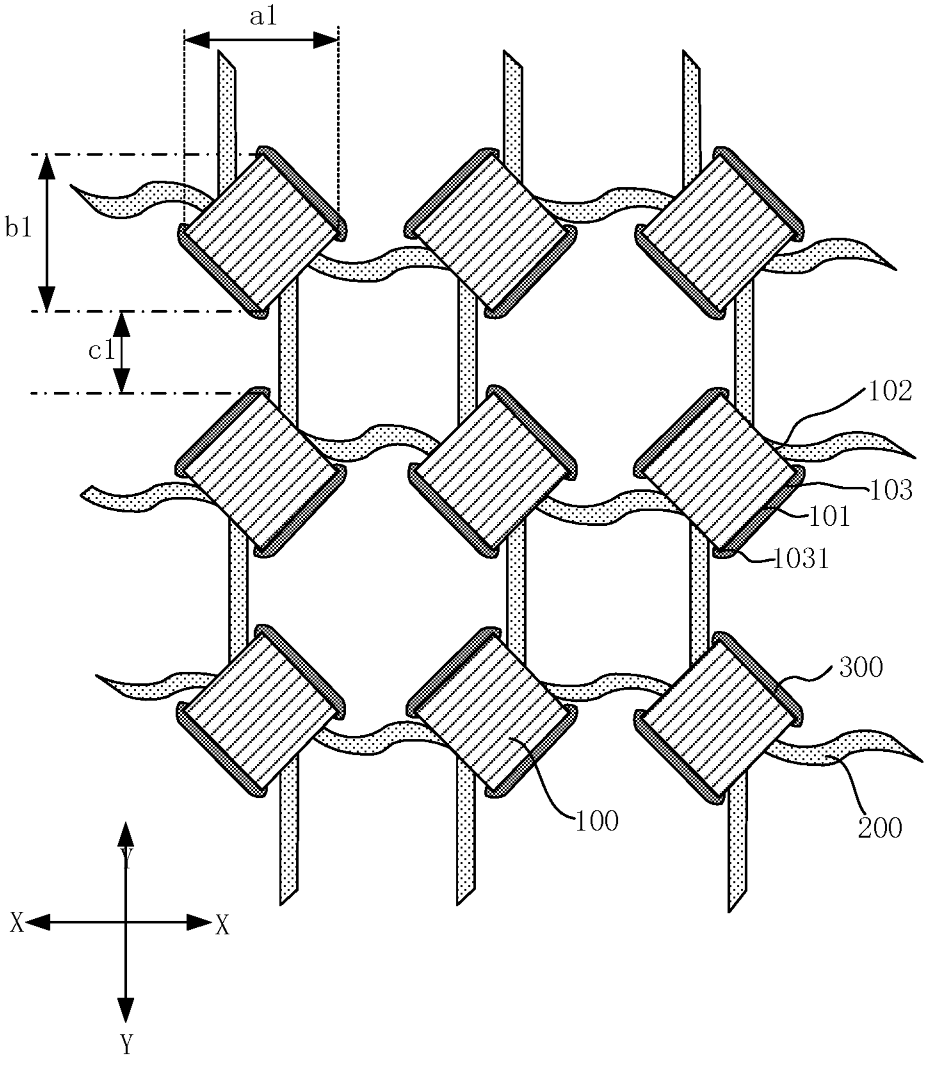
FIG. 3 is a plan schematic view of a plurality of pixel islands in a first display region in a stretched state according to embodiments of the present disclosure.

FIG. 1 is a plan schematic view of a stretchable display panel according to embodiments of the present disclosure. FIG. 2 is a plan schematic view of a plurality of pixel islands in a first display region in a non-stretched state according to Example 1 of the present disclosure. FIG. 3 is a plan schematic view of a plurality of pixel islands in a first display region in a stretched state according to Example 1 of the present disclosure. As shown in FIGS. 1 to 3, in a first aspect, according to embodiments of the present disclosure, it is provided a stretchable display panel 1 including a plurality of pixel islands 100 and a plurality of stretchable bridges 200. Each of the stretchable bridges 200 connects two adjacent ones of the pixel islands 100. The edge 101 of the pixel island 100 includes at least one first edge portion 102 and a second edge portion 103 other than the at least one first edge portion 102. The pixel island 100 is connected to the stretchable bridge 200 at the first edge portion 102. The stretchable display panel also includes an anti-deformation layer 300 disposed at least partially on a periphery of the second edge portion 102.

The stretchable display panel provided in the present disclosure includes a stretched state and a non-stretched state. When the stretchable display panel is in the stretched state, the stretchable bridges 200 are in the stretched state, and the stretchable bridges 200 connecting to the pixel islands 100 applies stress to the pixel islands 100. Since the stretchable display panel further includes the anti-deformation layer 300 capable of supporting the edge 101 of the pixel island 100, each anti-deformation layer 300 has a capability of preventing the edge 101 of the corresponding pixel island 100 from changing in shape, thereby improving a problem that the edge 101 of this pixel island 100 changes in shape due to the stress applied to this pixel island 100 by the stretchable bridge(s) 200, which improves the display effect of the stretchable display panel and enhances the reliability of the stretchable display panel.

In some embodiments of the present disclosure, the anti-deformation layer 300 has a first elastic modulus and the stretchable bridge 200 has a second elastic modulus. The first elastic modulus is greater than the second elastic modulus.

In the stretchable display panel provided in embodiments of the present disclosure, since the first elastic modulus is greater than the second elastic modulus, the anti-deformation capability of the anti-deformation layer 300 is greater than the anti-deformation capability of the stretchable bridge 200. In this way, the support capability of the anti-deformation layer 300 to the edge 101 of the pixel island 100 is further improved, the problem of deformation of the pixel island 100 in the stretched state is improved, the display effect of the stretchable display panel is further improved and the reliability of the stretchable display panel is enhanced.

In some embodiments of the present disclosure, the material of the anti-deformation layer 300 is a metallic material.

In the stretchable display panel provided in embodiments of the present disclosure, since the metal material has a preferable anti-deformation capability, the parasitic capacitance between the pixel islands 100 can be reduced, and the display effect of the stretchable display panel can be improved.

In some embodiments of the present disclosure, the material of the anti-deformation layer 300 is an insulating material.

In the stretchable display panel provided in embodiments of the present disclosure, since the stretchable display panel has a non-stretched state, the stretchable bridge 200 may be in a tortuous state when the stretchable display panel in the non-stretched state, so that the distance between the stretchable bridge 200 and the anti-deformation layer 300 is reduced or even contacted, and a short circuit problem is easily caused. By providing the material of the anti-deformation layer 300 as an insulating material in embodiments of the present disclosure, the service stability of the stretchable display panel may be improved and the service life of the same is prolonged.

In some embodiments of the present disclosure, the pixel island 100 has a third elastic modulus, the first elastic modulus is greater than the third elastic modulus, and the third elastic modulus is greater than the second elastic modulus.

In the stretchable display panel provided in embodiments of the present disclosure, since the third elastic modulus is greater than the second elastic modulus, the anti-deformation capability of the pixel island 100 is greater than the anti-deformation capability of the stretchable bridge 200, so that the problem of deformation of the pixel island 100 in the stretched state can be further improved, the display effect of the stretchable display panel is further improved, and the reliability of the stretchable display panel is enhanced.

In some embodiments of the present disclosure, in the non-stretched state, the edge 101 of the pixel island 100 is of a quadrilateral shape. The second edge portion 103 includes four edge corner portions 1031, and the anti-deformation layer 300 surrounds the four edge corner portions 1031.

In the stretchable display panel provided in embodiments of the present disclosure, since the four edge corner portions 1031 of the quadrilateral shape play an important role in defining the shape of the edge 101 of the pixel island 100, the first edge portion(s) dodge the four edge corner portions 1031 of the quadrilateral shape, and the anti-deformation layer 300 is enabled to surround the four edge corner portions 1031 of the quadrilateral shape in embodiments of the present disclosure. In this way, the ability of the anti-deformation layer 300 to support the edge 101 of the pixel island 100 is further enhanced, the deformation of the pixel island 100 in the stretched state is improved, the display effect of the stretchable display panel is further improved, and the reliability of the stretchable display panel is enhanced.

In some embodiments of the present disclosure, in the non-stretched state, one edge corner portion 1031 of one of two adjacent pixel islands 100 is arranged oppositely with one edge corner portion 1031 of another one of the two adjacent pixel islands 100.

In the stretchable display panel provided in embodiments of the present disclosure, since the first edge portion(s) 102 dodge the four edge corner portions 1031 of the quadrilateral shape, the first edge portion(s) 102 are disposed on the sides of the quadrilateral shape. Since one of the edge corner portions 1031 of one of the two adjacent pixel islands 100 is arranged oppositely with one of the edge corner portions 1031 of the other one of the two adjacent pixel islands 100 in the non-stretched state, comparted with the side-to-side arrangement of the two adjacent pixel islands 100, the corner-to-corner arrangement of the adjacent two pixel islands 100 may extend the distance between the two ends of the stretchable bridge 200 under the same pixel density condition. In this way, the maximum stretching length of the stretchable display panel may be increased, and the stretchability of the stretchable display panel may be improved.

In some embodiments of the present disclosure, in the stretched state, one of the edge corner portions 1031 of one of the two adjacent pixel islands 100 is arranged oppositely with one of the edge corner portions 1031 of another one of the two adjacent pixel islands 100.

With continued reference to FIG. 2, in the non-stretched state, the stretchable bridge 200 connecting two adjacent pixel islands 100 in a first direction X is in a bent state, the stretchable bridge 200 connecting two adjacent pixel islands 100 in a second direction Y is in a bent state, a maximum distance of the pixel island 100 in the first direction X is denoted by a, and a maximum distance of the pixel island 100 in the second direction Y is denoted by b.

With continued reference to FIG. 3, when the stretchable display panel is stretched in the second direction Y, a stretchable bridge 200 connecting to two adjacent pixel islands 100 in the first direction X is in the bent state, the stretchable bridge 200 connecting to two adjacent pixel islands 100 in the second direction Y is in a straight (or nearly straight) state, a maximum distance of the pixel island 100 in the first direction X is denoted by al, and a maximum distance of the pixel island 100 in the second direction Y is denoted by b1. The distance al is equal to the distance a, the distance b1 is equal to the distance b, and the distance cl is greater than the distance c.

That is, when the stretchable display panel is in the stretched state, the spacing distance between two adjacent pixel islands 100 in the stretching direction becomes larger, whereas the shapes and the areas of the pixel islands 100 are not changed under the restriction of the anti-deformation layers of these pixel islands. That is to say, the shapes of the pixel islands 100 in the stretched state are the same as the shapes of the pixel islands 100 in the non-stretched state. The area of each pixel island 100 in the stretched state is the same as the area of this pixel island 100 in the non-stretched state. So, the display effect of the stretchable display panel can be improved, and the reliability of the stretchable display panel can be enhanced.

In some embodiments of the present disclosure, the stretchable display panel includes a display region 10 and a non-display region 20 surrounding the display region 10. The display region 10 includes a first display region 11 and a second display region 12. A plurality of pixel islands 100 are provided in the first display region 11 and the second display region 12, and the second display region 12 surrounds the first display region 11. The edge 101 of each pixel island 100 in the first display region 11 includes four first edge portions 102.

In the stretchable display panel provided in embodiments of the present disclosure, since the pixel islands 100 are also provided in the second display region 12, and the second display region 12 surrounds the first display region 11, other pixel islands 100 are still provided at a periphery of the pixel islands 100 at an outermost edge of the first display region 11. In the related art, the stretching direction of the stretchable display panel includes at least two directions that are the first direction X and the second direction Y, and each pixel island 100 in the first display region 11 needs to be connected to at least four other pixel islands 100, so that each pixel island 100 in the first display region 11 needs to include at least four first edge portions 102. According to embodiments of the present disclosure, by making the edge 101 of each pixel island 100 in the first display region 11 include four first edge portions 102, the number of the first edge portions 102 in the first display region 11 can be maximally decreased. In this way, an edge portion of the edge 101 which excludes the first edge portions 102 can be maximized, and further more space can be provided for the setting of the anti-deformation layer 300, thereby further enhancing the ability of the anti-deformation layer 300 to support the edge 101 of the pixel island 100, improving the problem of deformation of the pixel island 100 in the stretched state, further improving the display effect of the stretchable display panel, and enhancing the reliability of the stretchable display panel.

In some embodiments of the present disclosure, in the pixel islands 100 in the first display region 11, two first edge portions 102 are located on one side of the quadrilateral shape and the other two first edge portions 102 are located on the other side of the quadrilateral shape, and the anti-deformation layer 300 surrounds the other two sides of the quadrilateral shape.

In the stretchable display panel provided in embodiments of the present disclosure, since the anti-deformation layer 300 not only surrounds the four edge corner portions 1031 of the quadrilateral shape, but also surrounds the other two side of the quadrilateral shape, the provision area of the anti-deformation layer 300 can be increased, the ability of the anti-deformation layer 300 to support the edge 101 of the pixel island 100 can be further enhanced, the problem of deformation of the pixel island 100 in the stretched state can be improved, the display effect of the stretchable display panel can be further improved, and the reliability of the stretchable display panel can be enhanced.

It should be noted that, in the non-stretched state, the shape of the pixel island 100 may also be a shape other than a quadrilateral shape, such as a circular shape or a polygon. When the shape of the pixel island 100 is circular in a non-stretched state, a periphery of other edge portions, which excludes the first edge portions 101, of the edge 101 may be provided with the anti-deformation layer 300. When the shape of the pixel island 100 is the polygon other than a quadrilateral shape in the non-stretched state, the anti-deformation layer 300 is provided at the periphery of each edge corner portion 1031 of the polygon.

It is noted that an edge of the anti-deformation layer 300 may be of an arched shape or a linear shape.

Figure 10:
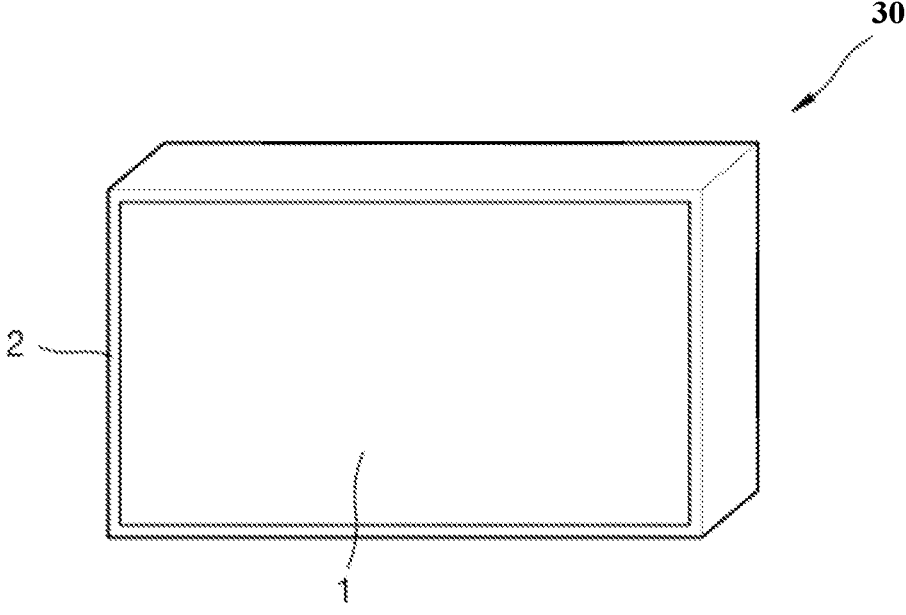
FIG. 10 is a perspective view showing a structure of a display device according to embodiments of the present disclosure.

In a second aspect, with reference to FIG. 10, Example 1 of the present disclosure further provides a display device 30 including a housing 2 and the above-mentioned stretchable display panel 1. The housing has a receiving space, the stretchable display panel is disposed in the receiving space, and the housing can be stretched.

Example 2

Figure 4:
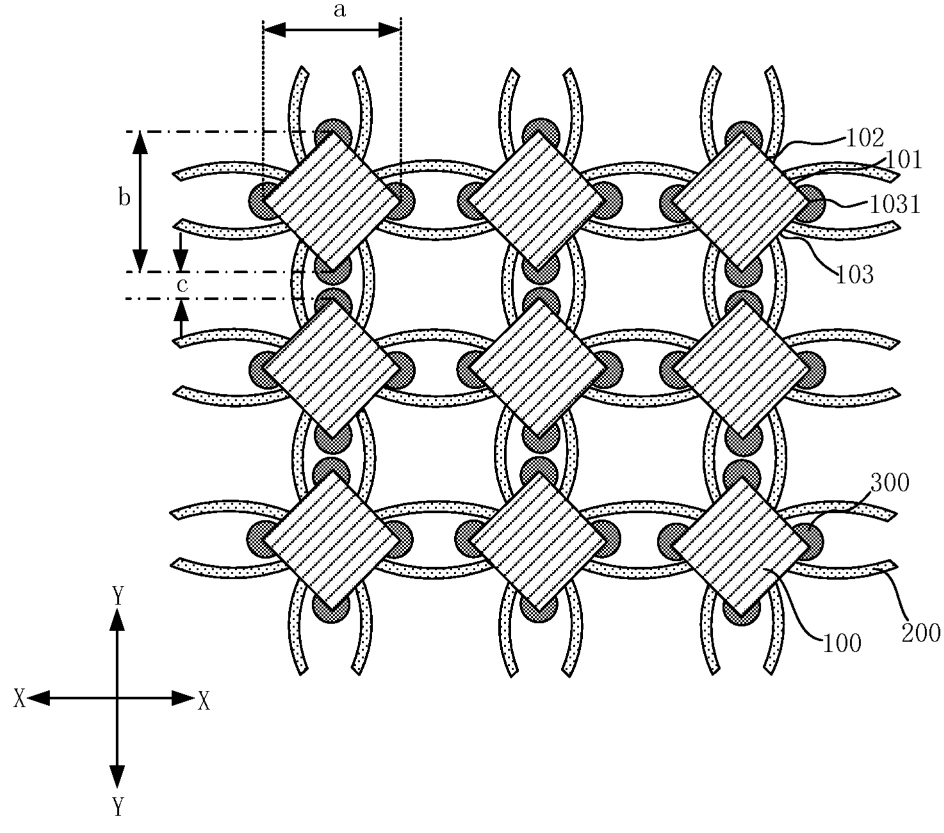
FIG. 4 is another plan schematic view of the plurality of pixel islands in the first display region in the non-stretched state according to embodiments of the present disclosure.
Figure 5:
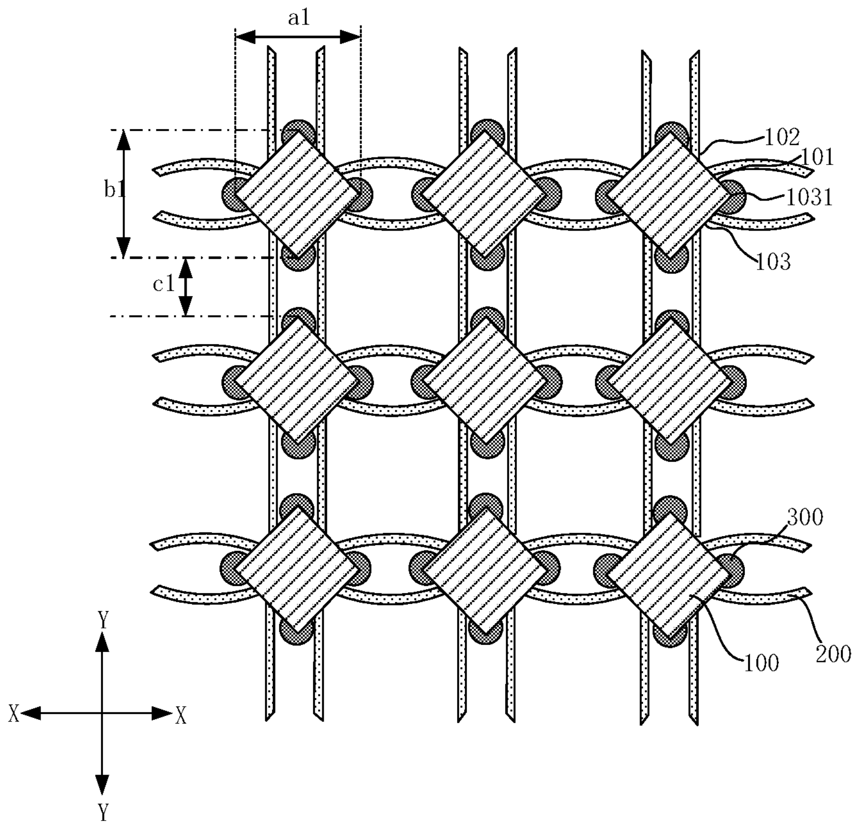
FIG. 5 is another plan schematic view of the plurality of pixel islands in the first display region in the stretched state according to embodiments of the present disclosure.

FIG. 4 is a plan schematic view of the pixel islands in a first display region in a non-stretched state according to Example 2 of the present disclosure, and FIG. 5 is a schematic plan view of the pixel islands in the first display region in a stretched state according to Example 2 of the present disclosure. As shown in FIG. 1, FIG. 4, and FIG. 5, in the first aspect, according to Example 2 of the present disclosure, it is provided a stretchable display panel 1 including a plurality of pixel islands 100 and a plurality of stretchable bridges 200. Each of the stretchable bridges 200 connects two adjacent ones of the pixel islands 100. The edge 101 of the pixel island 100 includes at least one first edge portion 102 and a second edge portion 103 other than the at least one first edge portion 102. The pixel island 100 is connected to the stretchable bridge 200 at the first edge portion 102. The stretchable display panel also includes an anti-deformation layer 300 disposed at least partially on a periphery of the second edge portion 102.

It should be noted that the structure of the stretchable display panel provided in Example 2 of the present disclosure is similar to that of the stretchable display panel provided in Example 1 of the present disclosure. For example, in the non-stretched state, the edge 101 of the pixel island 100 is of a quadrilateral shape, and the second edge portion 103 includes four edge corner portions 1031. The anti-deformation layer 300 surrounds the four edge corner portions 1031. In the non-stretched state, one of the edge corner portions 1031 of one of the two adjacent pixel islands 100 is arranged oppositely with one of the edge corner portions 1031 of another one of the two adjacent pixel islands 100. In the stretched state, one of the edge corner portions 1031 of one of the two adjacent pixel islands 100 is arranged oppositely with one of the edge corner portions 1031 of another one of the two adjacent pixel islands 100. Details of the same portions are not described in Example 2 of the present disclosure.

Differently, the stretchable display panel includes a display region 10 including a first display region 11 and a second display region 12, a plurality of pixel islands 100 are provided in the first display region 11 and the second display region 12, and the second display region 12 surrounds the first display region 11, in which the edge 101 of each pixel island 100 in the first display region 11 includes eight first edge portions 102.

In the stretchable display panel provided in embodiments of the present disclosure, since the edge 101 of each pixel island 100 in the first display region 11 includes the eight first edge portions 102, the more the number of the first edge portions 102, the more the number of the stretchable bridges 200. Therefore, the tactile feedback from the user in terms of stretching the stretchable display panel can be improved and the user's experience can be improved.

In some embodiments of the present disclosure, in the pixel islands 100 in the first display region 11, each of the sides of the quadrilateral shape is provided with two first edge portions 102.

In the stretchable display panel provided in embodiments the present disclosure, each side of the quadrilateral shape is provided with two first edge portions 102, so that the first edge portion(s) 102 of the edge 101 of the pixel island 100 are set more regularly, and the arrangement of the stretchable bridges 200 are more regularly. So, the stretching amount of different regions of the stretchable display panel in the stretched state can be more homogenized, thereby improving the display quality of the stretchable display panel in the stretched state.

In some embodiments of the present disclosure, two sides of each of the edge corner portions 1031 are each provided with two first edge portions 102.

With continued reference to FIG. 4, in the non-stretched state, the stretchable bridge 200 connected to two adjacent pixel islands 100 in the first direction X is in the bent state, the stretchable bridge 200 connected to two adjacent pixel islands 100 in the second direction Y is in the bent state, the maximum distance of the pixel island 100 in the first direction X is denoted by a, and the maximum distance of the pixel island 100 in the second direction Y is denoted by b.

With continued reference to FIG. 5, when the stretchable display panel is stretched in a second direction Y, a stretchable bridge 200 connected to two adjacent pixel islands 100 in the first direction X is in a bent state, a stretchable bridge 200 connected to two adjacent pixel islands 100 in the second direction Y is in a straight (or nearly straight) state, a maximum distance of the pixel island 100 in the first direction X is denoted by al, and a maximum distance of the pixel island 100 in the second direction Y is denoted by b1. The maximum distance al is equal to the maximum distance a, the maximum distance b1 is equal to the maximum distance b, and the maximum distance cl is greater than the maximum distance c.

That is, when the stretchable display panel is in a stretched state, the distance between two adjacent pixel islands 100 in the stretching direction becomes larger, whereas the shapes and the areas of the pixel islands 100 are not changed due to the limitation of the anti-deformation layers, so that the display effect of the stretchable display panel can be improved and the reliability of the display panel can be enhanced.

In a second aspect, with reference to FIG. 10, according to Example 2 of the present disclosure, it is further provided a display device 30 including a housing 2 and the above-mentioned stretchable display panel 1. The housing has a receiving space, the stretchable display panel 1 is disposed in the receiving space, and the housing is capable of being stretched.

Example 3

Figure 6:
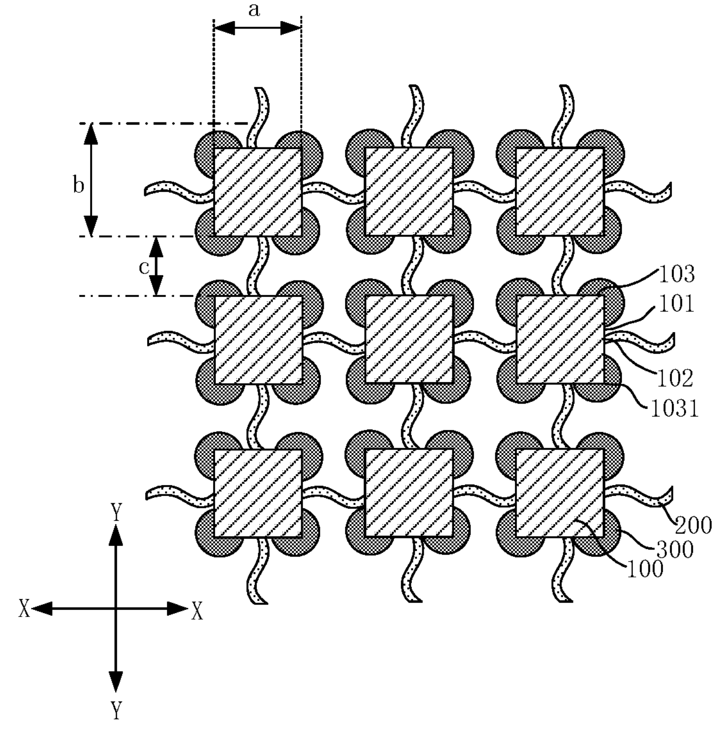
FIG. 6 is yet another plan schematic view of the plurality of pixel islands in the first display region in the non-stretched state according to embodiments of the present disclosure.
Figure 7:
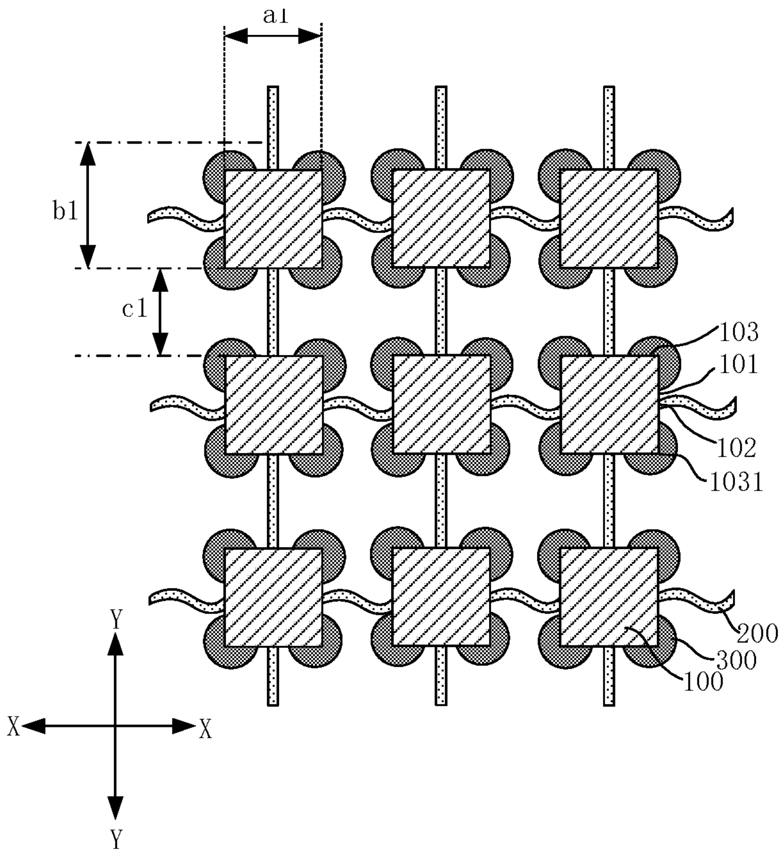
FIG. 7 is yet another plan schematic view of the plurality of pixel islands in the first display region in the stretched state according to embodiments of the present disclosure.

FIG. 6 is a plan schematic view of a plurality of pixel islands in a first display region in a non-stretched state according to Example 3 of the present disclosure, and FIG. 7 is a plan schematic view of a plurality of pixel islands in a first display region in a stretched state according to Example 3 of the present disclosure. As shown in FIG. 1, FIG. 6, and FIG. 7, in a first aspect, according to Example 3 of the present disclosure, it is provided a stretchable display panel 1 including a plurality of pixel islands 100 and a plurality of stretchable bridges 200. Each of the stretchable bridges connects two adjacent ones of the pixel islands 100. The edge 101 of the pixel island 100 includes at least one first edge portion 102 and a second edge portion 103 other than the at least one first edge portion 102. The pixel island 100 is connected to the stretchable bridge 200 at the first edge portion 102. The stretchable display panel also includes an anti-deformation layer 300 disposed at least partially on the periphery of the second edge portion 102.

It should be noted that the structure of the stretchable display panel provided in Example 3 of the present disclosure is similar to that of the stretchable display panel provided in Example 1 of the present disclosure. For example, in a non-stretched state, the edge 101 of the pixel island 100 is of a quadrilateral shape, the four edge corner portions 1031 of the quadrilateral shape are the edge portions that exclude the first edge portion(s) 102, and the anti-deformation layer 300 surrounds the four edge corner portions 1031 of the quadrilateral shape. Details of the same portions are not described in Example 3 of the present disclosure.

However, in the non-stretched state, one side of one of the two adjacent pixel islands 100 is arranged oppositely with one side of the other one of the two adjacent pixel islands 100.

In the stretchable display panel provided in the present disclosure, since one of the sides of one of the two adjacent pixel islands 100 is arranged oppositely with one of the sides of the other one of the two adjacent pixel islands 100, it is possible to enable the pixel islands 100 to have an array arrangement manner of a matrix type, which is advantageous for improving the production efficiency of the stretchable display panel and reducing the production cost.

In some embodiments of the present disclosure, in a stretched state, one side of one of the two adjacent pixel islands 100 is arranged oppositely with one side of another one of the two adjacent pixel islands 100.

In some embodiments of the present disclosure, the stretchable display panel includes a display region 10 and a non-display region 20 surrounding the display region 10. The display region 10 includes a first display region 11 and a second display region 12. A plurality of pixel islands 100 are provided in the first display region 11 and the second display region 12, and the second display region 12 surrounds the first display region 11. The edge 101 of each pixel islands 100 in the first display region 11 includes four first edge portions 102.

In the stretchable display panel provided in the present disclosure, since a plurality of pixel islands 100 are also provided in the second display region 12, and the second display region 12 surrounds the first display region 11, other pixel islands 100 are still provided at the periphery of the pixel islands 100 at the outermost edge of the first display region 11. In the related art, the stretching direction of the stretchable display panel includes at least two directions that are a first direction X and a second direction Y. That is, each pixel island 100 in the first display region 11 needs to be connected to at least four other pixel islands 100, so that each pixel island 100 in the first display region 11 needs to include at least four first edge portions 102. According to embodiments of the present disclosure, by making the edge 101 of each pixel island 100 in the first display region 11 include four first edge portions 102, the number of the first edge portions 102 in the first display region 11 can be maximally decreased. So, an edge portion, which excludes the first edge portion(s) 102, of the edge 101 of each pixel island 100 can be maximized, and further more space can be provided for the setting of the anti-deformation layer 300, thereby further enhancing the ability of the anti-deformation layer 300 to support the edge 101 of the pixel island 100, improving the problem of deformation of the pixel island 100 in the stretched state, further improving the display effect of the display panel, and enhancing the reliability of the stretchable display panel.

In some embodiments of the present disclosure, in the pixel islands 100 in the first display region 11, each of the sides of the quadrilateral shape is provided with one of the first edge portions 102.

In the stretchable display panel provided in the present disclosure, since each side of the quadrilateral shape is provided with one first edge portion 102, the first edge portions 102 of the edge 101 of each pixel island 100 is set more regularly, and the arrangement of the stretchable bridges 200 is more regularly, so that the stretching amount of different regions of the stretchable display panel in the stretched state can be more homogenized, thereby improving the display quality of the stretchable display panel in the stretched state.

With continued reference to FIG. 6, in a non-stretched state, the stretchable bridge 200 connecting two adjacent pixel islands 100 in a first direction X is in a bent state, the stretchable bridge 200 connecting two adjacent pixel islands 100 in a second direction Y is in a bent state, the maximum distance of the pixel island 100 in the first direction X is denoted by a, and the maximum distance of the pixel island 100 in the second direction Y is denoted by b.

With continued reference to FIG. 7, when the stretchable display panel is stretched in a second direction Y, a stretchable bridge 200 connected to two adjacent pixel islands 100 in the first direction X is in a bent state, a stretchable bridge 200 connected to two adjacent pixel islands 100 in the second direction Y is in a straight (or nearly straight) state, a maximum distance of the pixel island 100 in the first direction X is denoted by al, and a maximum distance of the pixel island 100 in the second direction Y is denoted by b1. The maximum distance al is equal to the maximum distance a, the maximum distance b1 is equal to the maximum distance b, and the maximum distance cl is greater than the maximum distance c.

That is, when the stretchable display panel is in a stretched state, the distance between two adjacent pixel islands 100 in the stretching direction becomes larger, whereas the shapes and the areas of the pixel islands 100 are not changed due to the limitation of the anti-deformation layers, so that the display effect of the stretchable display panel can be improved and the reliability of the display panel can be enhanced.

In a second aspect, with reference to FIG. 10, according to Example 3 of the present disclosure, it is further provided a display device 30 including a housing 2 and the above-mentioned stretchable display panel 1. The housing has a receiving space, the stretchable display panel is disposed in the receiving space, and the housing can be stretched.

Example 4

Figure 8:
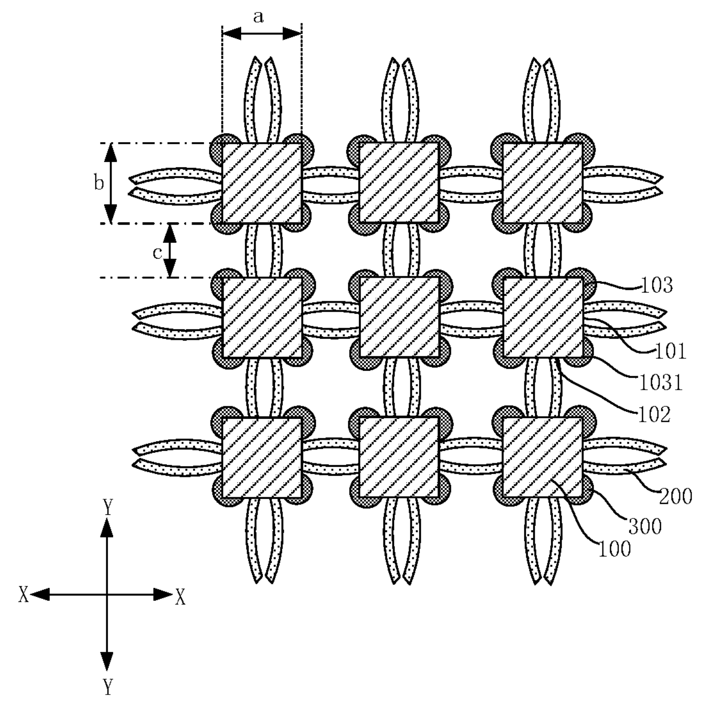
FIG. 8 is yet another plan schematic view of the plurality of pixel islands in the first display region in the non-stretched state according to embodiments of the present disclosure.
Figure 9:
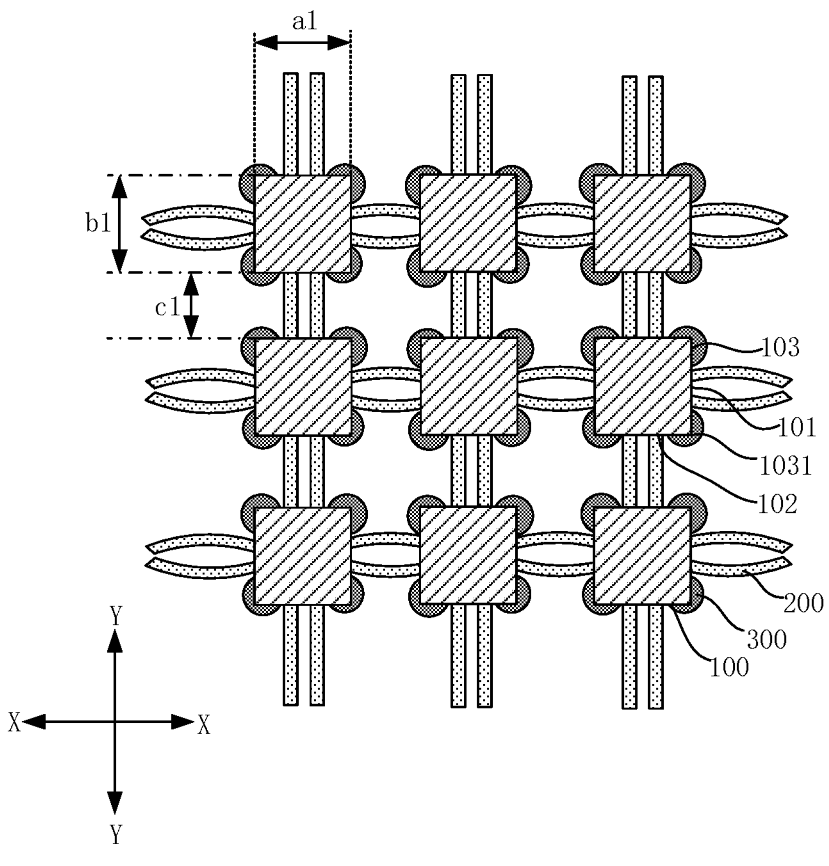
FIG. 9 is yet another plan schematic view of the plurality of pixel islands in the first display region in the stretched state according to embodiments of the present disclosure.

FIG. 8 is a plan schematic view of a plurality of pixel islands in a first display region in a non-stretched state according to Example 4 of the present disclosure, and FIG. 9 is a plan schematic view of a plurality of pixel islands in a first display region in a stretched state according to Example 4 of the present disclosure. As shown in FIG. 1, FIG. 8, and FIG. 9, in a first aspect, according to Example 4 of the present disclosure, it is provided a stretchable display panel 1 including a plurality of pixel islands 100 and a plurality of stretchable bridges 200. Each of the stretchable bridge connects two adjacent ones of the pixel islands 100. The edge 101 of the pixel island 100 includes at least one first edge portion 102 and a second edge portion 103 other than the at least one first edge portion 102, and the pixel island 100 is connected to the stretchable bridge 200 at the first edge portion 102. The stretchable display panel also includes an anti-deformation layer 300 disposed at least partially on the periphery of the second edge portion 102.

It should be noted that the structure of the stretchable display panel provided in Example 4 of the present disclosure is similar to that of the stretchable display panel provided in Example 3 of the present disclosure. In a non-stretched state, the edge 101 of the pixel island 100 is of a quadrilateral shape, the four edge corner portions 1031 of the quadrilateral shape are the edge portion that excludes the first edge portion 102, and the anti-deformation layer 300 surrounds the four edge corner portions 1031 of the quadrilateral shape. In the non-stretched state, one of the sides of one of the two adjacent pixel islands 100 is arranged oppositely with one of the sides of the other one of the two adjacent pixel islands 100, and the Example 4 of the present disclosure will not be repeated for the same portions.

Differently, the stretchable display panel includes a display region 10 including a first display region 11 and a second display region 12, a plurality of pixel islands 100 are provided in the first display region 11 and the second display region 12, and the second display region 12 surrounds the first display region 11, in which the edge 101 of each pixel islands 100 in the first display region 11 includes eight first edge portions 102.

In the stretchable display panel provided in the present disclosure, since the edge 101 of each pixel islands 100 in the first display region 11 includes the eight first edge portions 102, the more the number of the first edge portions 102, the more the number of the stretchable bridges 200. Therefore, the tactile feedback from the user in terms of stretching the stretchable display panel can be improved and the user's experience can be improved.

In some embodiments of the present disclosure, in the pixel islands 100 in the first display region 11, each of the sides of the quadrilateral shape is provided with two first edge portions 102.

In the stretchable display panel provided in embodiments of the present disclosure, each side of the quadrilateral shape is provided with two first edge portions 102, so that the first edge portions 102 of the edge 101 of each pixel island 100 is set more regularly, and the arrangement of the stretchable bridges 200 is more regularly. So, the stretching amount of different regions of the stretchable display panel in the stretched state can be more homogenized, thereby improving the display quality of the stretchable display panel in the stretched state.

In some embodiments of the present disclosure, two sides of each of the edge corner portions 1031 are each provided with two first edge portions 102.

With continued reference to FIG. 8, in a non-stretched state, the stretchable bridge 200 connected to two adjacent pixel islands 100 in a first direction X is in a bent state, the stretchable bridge 200 connected to two adjacent pixel islands 100 in a second direction Y is in a bent state, the maximum distance of the pixel island 100 in the first direction X is denoted by a, and the maximum distance of the pixel island 100 in the second direction Y is denoted by b.

With continued reference to FIG. 9, when the stretchable display panel is stretched in a second direction Y, a stretchable bridge 200 connected to two adjacent pixel islands 100 in the first direction X is in a bent state, a stretchable bridge 200 connected to two adjacent pixel islands 100 in the second direction Y is in a straight (or nearly straight) state, a maximum distance of the pixel island 100 in the first direction X is denoted by al, and a maximum distance of the pixel island 100 in the second direction Y is denoted by b1. The maximum distance al is equal to the maximum distance a, the maximum distance b1 is equal to the maximum distance b, and the maximum distance cl is greater than c.

That is, when the stretchable display panel is in a stretched state, the distance between two adjacent pixel islands 100 in the stretching direction becomes larger, but the shapes and the areas of the pixel islands 100 are not changed due to the limitation of the anti-deformation layers, so that the display effect of the stretchable display panel can be improved and the reliability of the display panel can be enhanced.

According to a second aspect, with reference to FIG. 10, according to Example 4 of the present disclosure, it is further provided a display device 30 including a housing 2 and the above-mentioned stretchable display panel 1. The housing has a receiving space, the stretchable display panel is disposed in the receiving space, and the housing can be stretched.

In summary, according to embodiments of the present disclosure, a stretchable display panel and a display device are provided. The stretchable display panel includes a plurality of pixel islands; and a plurality of stretchable bridges each of which connecting two adjacent ones of the pixel islands. An edge of the pixel island includes at least one first edge portion and a second edge portion other than the at least one first edge portion. The pixel island is connected to the stretchable bridge at the first edge portion. The stretchable display panel further includes an anti-deformation layer disposed at least partially of at the periphery of the second edge portion. The anti-deformation layer is capable of supporting the edge of the pixel island and having an ability to prevent the edge shape of the pixel island from changing, thereby improving a problem that the edge shape of the pixel island changes due to stress applied to the pixel island by the stretchable bridges, which improves the display effect of the stretchable display panel and enhances the reliability of the stretchable display panel.

The foregoing describes in detail a stretchable display panel and a display device according to embodiments of the present disclosure, the principles and implements of the present disclosure are described herein by using specific examples, and the description of the above embodiments is merely provided to assist in understanding the method of the present disclosure and the core idea thereof. At the same time, variations will occur to those skilled in the art in both the detailed description and the scope of disclosure in accordance with the teachings of the present disclosure. In view of the foregoing, the present description should not be construed as limiting the disclosure.

What is claimed is:

1. A stretchable display panel, comprising:

a plurality of pixel islands; and a plurality of stretchable bridges, each of which connects two adjacent ones of the pixel islands;

wherein an edge of each of the pixel islands comprises at least one first edge portion and a second edge portion other than the at least one first edge portion, and the at least one first edge portion connects the pixel island and corresponding ones of the stretchable bridges;

the stretchable display panel further comprises an anti-deformation layer disposed at least partially on a periphery of the second edge portion; wherein the anti-deformation layer surrounds and is in contact with the periphery of the second edge portion.

2. The stretchable display panel according to claim 1, wherein the anti-deformation layer has a first elastic modulus, and the stretchable bridge has a second elastic modulus, wherein the first elastic modulus is greater than the second elastic modulus.

3. The stretchable display panel according to claim 2, wherein a material of the anti-deformation layer comprises one of an insulating material and a metal material.

4. The stretchable display panel according to claim 2, wherein the pixel island has a third elastic modulus, the first elastic modulus is greater than the third elastic modulus, and the third elastic modulus is greater than the second elastic modulus.

5. The stretchable display panel according to claim 1, wherein the stretchable display panel comprises a stretched state, and a non-stretched state in which the edge of the pixel island is of a quadrilateral shape and the second edge portion comprises four edge corner portions, wherein the anti-deformation layer surrounds the four edge corner portions.

6. The stretchable display panel according to claim 5, wherein, in the non-stretched state, one of the four edge corner portions of one of the two adjacent pixel islands is arranged oppositely with one of the four edge corner portions of an other one of the two adjacent pixel islands;

in the stretched state, one of the four edge corner portions of one of the two adjacent pixel islands is arranged oppositely with one of the four edge corner portions of an other one of the two adjacent pixel islands.

7. The stretchable display panel according to claim 6, wherein the stretchable display panel comprises a display region and a second display region, the plurality of pixel islands are provided in the first display region and the second display region, and the second display region surrounds the first display region, wherein the edge of each of ones, which are in the first display region, of the pixel islands comprises four of the at least one first edge portion.

8. The stretchable display panel according to claim 7, wherein in the ones of the pixel islands which are in the first display region, two of the four first edge portions are located on one side of the quadrilateral shape and other two of the four first edge portions are located on an other side of the quadrilateral shape, and the anti-deformation layer surrounds other two sides of the quadrilateral shape.

9. The stretchable display panel according to claim 6, wherein the stretchable display panel comprises a display region comprising a first display region and a second display region, the plurality of pixel islands are provided in the first display region and the second display region, and the second display region surrounds the first display region, wherein the edge of each of ones, which are in the first display region, of the pixel islands comprises eight of the at least one first edge portion.

10. The stretchable display panel according to claim 9, wherein in the ones of the pixel islands which are in the first display region, each side of the quadrilateral shape is provided with two of the at least one first edge portion.

11. The stretchable display panel according to claim 5, wherein, in the non-stretched state, one of sides of one of the two adjacent pixel islands is arranged oppositely with one of sides of an other one of the two adjacent pixel islands;

in the stretched state, one of sides of one of the two adjacent pixel islands is arranged oppositely with one of sides of an other one of the two adjacent pixel islands.

12. The stretchable display panel according to claim 11, wherein the stretchable display panel comprises a display region comprising a first display region and a second display region, the plurality of pixel islands are provided in the first display region and the second display region, and the second display region surrounds the first display region, wherein the edge of each of ones, which are in the first display region, of the pixel islands comprises four of the at least one first edge portion.

13. The stretchable display panel according to claim 12, wherein in the ones of the pixel islands which are in the first display region, each of the sides of the pixel island is provided with one of the four first edge portions.

14. The stretchable display panel according to claim 11, wherein the stretchable display panel comprises a display region comprising a first display region and a second display region, the plurality of pixel islands are provided in the first display region and the second display region, and the second display region surrounds the first display region, wherein the edge of each of ones, which are in the first display region, of the pixel islands comprises eight of the at least one first edge portion.

15. The stretchable display panel according to claim 14, wherein in the ones of the pixel islands which are in the first display region, each of the sides of the pixel island is provided with two of the eight first edge portions.

16. The stretchable display panel according to claim 1, wherein the edge of the pixel island is of a circular shape or a polygon.

17. The stretchable display panel according to claim 1, wherein the pixel island in a stretched state has a same shape as the pixel island in a non-stretched state; and the pixel island in the stretched state has a same area as the pixel island in the non-stretched state.

18. A display device comprising:

a housing having a receiving space; and a stretchable display panel comprising:

a plurality of pixel islands; and a plurality of stretchable bridges, each of which connects two adjacent ones of the pixel islands;

wherein an edge of each of the pixel islands comprises at least one first edge portion and a second edge portion other than the at least one first edge portion, and the at least one first edge portion connects the pixel island and corresponding ones of the stretchable bridges; the stretchable display panel further comprises an anti-deformation layer disposed at least partially on a periphery of the second edge portion; wherein the anti-deformation layer surrounds and is in contact with the periphery of the second edge portion;

the stretchable display panel is disposed in the receiving space, and the housing is capable of being stretched.

* * * * *